(12) United States Patent
Imai

(10) Patent No.: US 9,209,112 B2
(45) Date of Patent: Dec. 8, 2015

(54) SEMICONDUCTOR DEVICE HAVING STACKED SUBSTRATES WITH PROTRUDING AND RECESSED ELECTRODE CONNECTION

(71) Applicant: Seiko Epson Corporation, Tokyo (JP)

(72) Inventor: Hideo Imai, Shimosuwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/504,957

(22) Filed: Oct. 2, 2014

(65) Prior Publication Data

US 2015/0054138 A1 Feb. 26, 2015

Related U.S. Application Data

(62) Division of application No. 13/403,338, filed on Feb. 23, 2012, now Pat. No. 9,000,575.

(30) Foreign Application Priority Data

Feb. 24, 2011 (JP) .................. 2011-037969

(51) Int. Cl.
*H01L 23/48* (2006.01)
*H01L 23/00* (2006.01)
(Continued)

(52) U.S. Cl.
CPC ........ *H01L 23/481* (2013.01); *H01L 21/76898* (2013.01); *H01L 23/562* (2013.01); *H01L 25/074* (2013.01); *H01L 25/0657* (2013.01); *H01L 2224/03462* (2013.01); *H01L 2224/0401* (2013.01); *H01L 2224/05009* (2013.01); *H01L 2224/0557* (2013.01); *H01L 2224/05553* (2013.01); *H01L 2224/05567* (2013.01); *H01L 2224/05571* (2013.01); *H01L 2224/05609* (2013.01); *H01L 2224/05611* (2013.01); *H01L 2224/05613* (2013.01); *H01L 2224/05616* (2013.01); *H01L 2224/05618* (2013.01); *H01L 2224/05624* (2013.01); *H01L 2224/05639* (2013.01); *H01L 2224/05647* (2013.01); *H01L 2224/05655* (2013.01); *H01L 2224/06181* (2013.01); *H01L 2224/11462* (2013.01); *H01L 2224/11464* (2013.01); *H01L 2224/13007* (2013.01); *H01L 2224/13017* (2013.01); *H01L 2224/13022* (2013.01);
(Continued)

(58) Field of Classification Search
CPC .... H01L 23/481; H01L 23/562; H01L 25/074
See application file for complete search history.

(56) References Cited

U.S. PATENT DOCUMENTS 4,807,021 A * 2/1989 Okumura ...................... 257/777
5,404,044 A * 4/1995 Booth et al. .................. 257/698
(Continued)

FOREIGN PATENT DOCUMENTS

JP 2000-286304 A 10/2000
JP 2001-244360 A 9/2001
(Continued)

*Primary Examiner* — Ida M Soward
(74) *Attorney, Agent, or Firm* — Harness, Dickey & Pierce, P.L.C.

(57) ABSTRACT

A first substrate with a penetration electrode formed thereon is stacked on a second substrate with a protruding electrode formed thereon. The penetration electrode has a recessed portion. The substrates are stacked with the protruding electrode entered in the recessed portion. A distal width of the protruding electrode is smaller than an opening width of the recessed portion.

8 Claims, 8 Drawing Sheets

(51) Int. Cl.
*H01L 25/07* (2006.01)
*H01L 21/768* (2006.01)
*H01L 25/065* (2006.01)

(52) U.S. Cl.
CPC ............. *H01L 2224/13144* (2013.01); *H01L 2224/16146* (2013.01); *H01L 2224/16147* (2013.01); *H01L 2224/8114* (2013.01); *H01L 2224/81191* (2013.01); *H01L 2224/81895* (2013.01); *H01L 2225/06513* (2013.01); *H01L 2225/06517* (2013.01); *H01L 2225/06541* (2013.01); *H01L 2924/01327* (2013.01)

(56) References Cited

U.S. PATENT DOCUMENTS

| | | | |
|---|---|---|---|
| 5,424,245 A | 6/1995 | Gurtler et al. | |
| 5,610,371 A | 3/1997 | Hashimoto et al. | |
| 5,861,663 A | 1/1999 | Isaacs et al. | |
| 5,898,575 A | 4/1999 | Hawthorne et al. | |
| 6,093,029 A | 7/2000 | Kwon et al. | |
| 6,100,585 A | 8/2000 | Chiba | |
| 6,113,406 A | 9/2000 | Lin et al. | |
| 6,114,221 A * | 9/2000 | Tonti et al. | 438/455 |
| 6,294,837 B1 | 9/2001 | Akram et al. | |
| 6,319,810 B1 | 11/2001 | Ochiai et al. | |
| 6,517,359 B1 | 2/2003 | Felps et al. | |
| 6,838,774 B2 * | 1/2005 | Patti | 257/773 |
| 7,045,443 B2 | 5/2006 | Matsui | |
| 7,119,425 B2 * | 10/2006 | Jeong et al. | 257/685 |
| 7,135,762 B2 | 11/2006 | Yamaguchi | |
| 7,262,082 B1 * | 8/2007 | Lin et al. | 438/109 |
| 7,290,321 B2 * | 11/2007 | Steinberg et al. | 29/464 |
| 7,538,413 B2 | 5/2009 | Wood et al. | |
| 7,550,835 B2 * | 6/2009 | Kang | 257/686 |
| 7,732,328 B2 | 6/2010 | Kwon et al. | |
| 7,808,060 B2 | 10/2010 | Hsiao | |
| 7,969,015 B2 | 6/2011 | Trezza | |
| 7,973,415 B2 | 7/2011 | Kawashita et al. | |
| 8,183,673 B2 | 5/2012 | Hwang et al. | |
| 8,193,093 B2 | 6/2012 | Chauhan | |
| 8,232,194 B2 * | 7/2012 | Trezza | 438/618 |
| 8,252,680 B2 | 8/2012 | Lavoie | |
| 8,288,853 B2 | 10/2012 | Huang et al. | |
| 8,368,195 B2 | 2/2013 | Tanie et al. | |
| 8,399,355 B2 | 3/2013 | Han | |
| 8,399,936 B2 | 3/2013 | Birner et al. | |
| 8,415,804 B2 * | 4/2013 | Lee et al. | 257/774 |
| 8,435,836 B2 | 5/2013 | Fay et al. | |
| 8,552,545 B2 | 10/2013 | Tanida et al. | |
| 8,623,700 B1 * | 1/2014 | Bernstein et al. | 438/107 |
| 8,637,989 B2 | 1/2014 | Lee et al. | |
| 2001/0028105 A1 | 10/2001 | Hashimoto et al. | |
| 2002/0084565 A1 * | 7/2002 | Dautartas et al. | 269/289 R |
| 2004/0072413 A1 | 4/2004 | Hashimoto et al. | |
| 2005/0051883 A1 | 3/2005 | Fukazawa | |
| 2005/0230804 A1 | 10/2005 | Tanida et al. | |
| 2005/0263869 A1 | 12/2005 | Tanaka et al. | |
| 2007/0080457 A1 | 4/2007 | Tanida et al. | |
| 2009/0189256 A1 | 7/2009 | Yoshimura et al. | |
| 2010/0059897 A1 | 3/2010 | Fay et al. | |
| 2010/0065949 A1 | 3/2010 | Thies et al. | |
| 2010/0097085 A1 | 4/2010 | Takatori | |
| 2010/0154211 A1 | 6/2010 | Uyama | |
| 2010/0182041 A1 | 7/2010 | Feng et al. | |
| 2010/0213618 A1 | 8/2010 | Pagaila et al. | |

FOREIGN PATENT DOCUMENTS

| | | |
|---|---|---|
| JP | 2005-101067 A | 4/2005 |
| JP | 4009846 B2 | 11/2007 |
| JP | 4074862 B2 | 4/2008 |
| JP | 4441328 B2 | 3/2010 |
| JP | 2010-147308 A | 7/2010 |

* cited by examiner

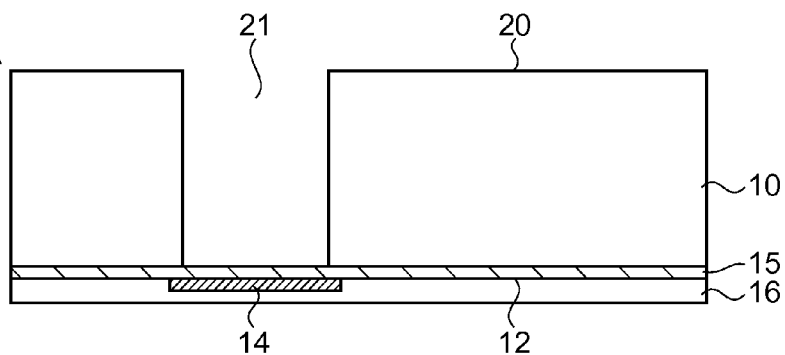
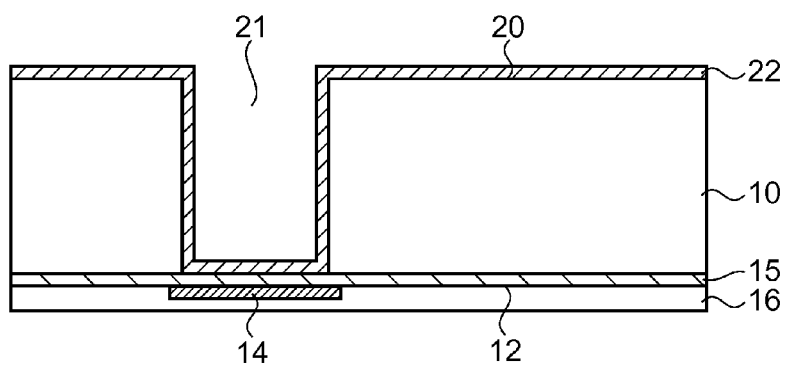
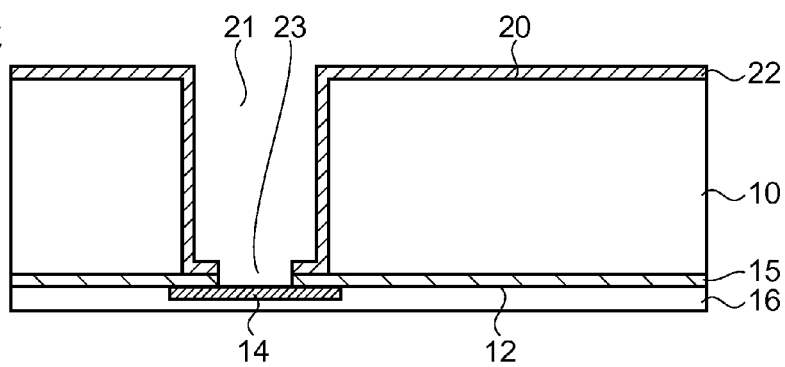
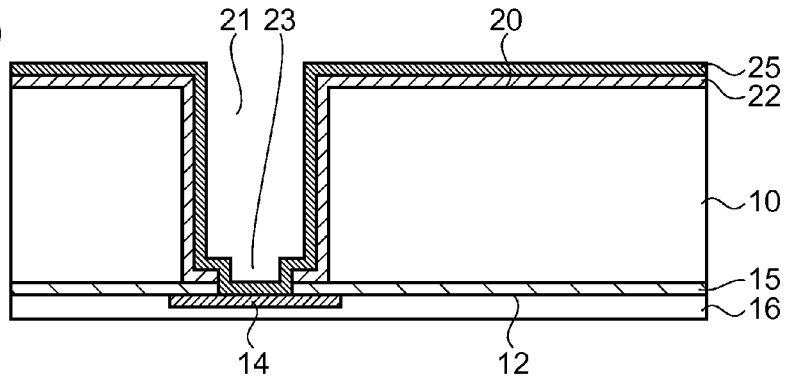

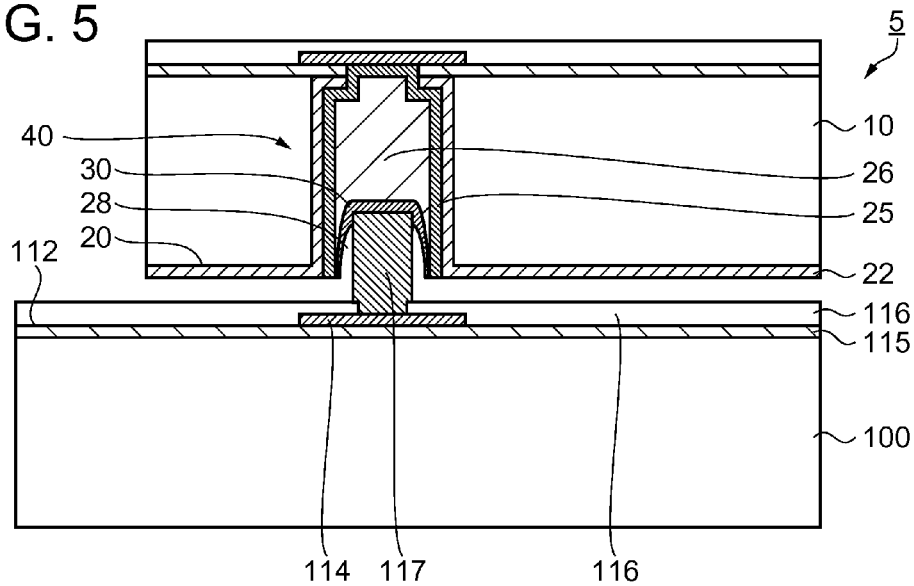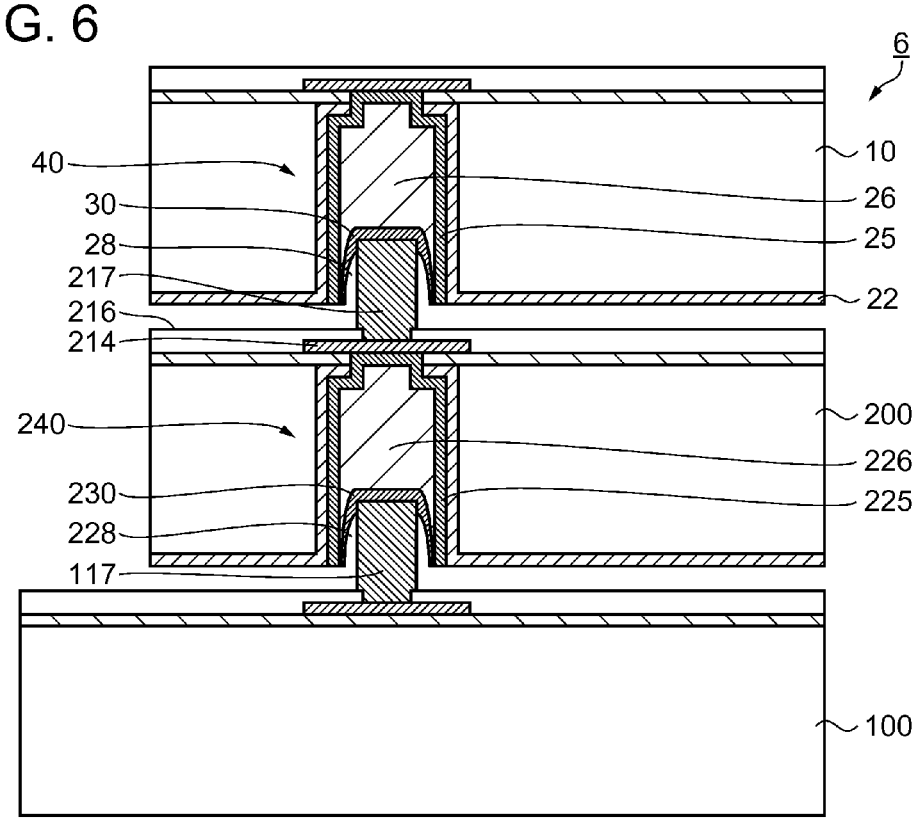

SEMICONDUCTOR DEVICE HAVING STACKED SUBSTRATES WITH PROTRUDING AND RECESSED ELECTRODE CONNECTION

CROSS-REFERENCE TO RELATED APPLICATIONS

This is a divisional patent application of U.S. application Ser. No. 13/403,338 filed Feb. 23, 2012, which claims priority to Japanese Patent Application No. 2011-037969, filed Feb. 24, 2011 all of which are expressly incorporated by reference herein in their entireties.

BACKGROUND

1. Technical Field

The present invention relates to a semiconductor device, and a sensor and electronic device having a semiconductor device.

2. Related Art

A semiconductor device is known in which semiconductor substrates having a penetration electrode formed therein are stacked, with the top and bottom semiconductor substrates electrically connected with each other via the penetration electrode.

In the related art, for example, as described in Japanese Patent No. 4,441,328, a method including providing a penetration electrode in one semiconductor substrate, providing a protruding electrode on the other semiconductor substrate, pressing the protruding electrode into a penetration hole and thus plastically deforming the protruding electrode, and electrically connecting the top and bottom semiconductor substrates in a caulked state, is known.

However, the semiconductor device described in Japanese Patent No. 4,441,328 has a problem that the semiconductor substrate cracks when the protruding electrode is pressed into the penetration hole of the semiconductor substrate.

SUMMARY

An advantage of some aspects of the invention is to solve at least a part of the problems described above, and the invention can be implemented as the following forms or application examples.

Application Example 1

This application example of the invention is directed to a semiconductor device including a first substrate having a main surface and a back surface situated opposite to each other, and a second substrate stacked on the first substrate and having a main surface and a back surface situated opposite to each other. The first substrate includes a penetration hole which penetrates the first substrate in a direction of thickness thereof, a penetration electrode formed inside the penetration hole, and a first electrode formed on the main surface. The second substrate includes a second electrode formed on the main surface of the second substrate, and a protruding electrode arranged on the second electrode and protruding from the main surface of the second substrate. The penetration electrode has a recessed portion on the back surface side. A bottom part of the recessed portion is situated toward the main surface from the back surface of the first substrate. The penetration electrode continues to the first electrode arranged on the main surface from the back surface of the first substrate. The first substrate and the second substrate are stacked on each other with the protruding electrode entered in the recessed portion. An opening width a of the recessed portion and a distal width b of the protruding electrode are in a relation of $a > b$.

According to this application example, since the distal width of the protruding electrode formed on the second substrate is smaller than the opening width of the recessed portion formed on the first substrate, the protruding electrode can easy enter the recessed portion when the first substrate and the second substrate are stacked on each other, and the substrates can be connected without being damaged.

Application Example 2

In the semiconductor device of the above application example, it is preferable that a depth c of the recessed portion in the first substrate and a height d of the protruding electrode on the second substrate are in a relation of $c < d$.

According to this application example, since the height of the protruding electrode is greater than the depth of the recessed portion, an appropriate space can be maintained between the first substrate and the second substrate, and reliability of connection between the first substrate and the second substrate can be improved.

Application Example 3

In the semiconductor device of the above application example, it is preferable that the recessed portion in the first substrate has an opening expanding toward the back surface from the bottom part.

According to this application example, since the recessed portion expands toward the back surface from the bottom part, the protruding electrode can enter the recessed portion more easily at the time of stacking, and the first substrate and the second substrate can be connected with each other without damaging the substrates.

Application Example 4

In the semiconductor device of the above application example, it is preferable that an insulating film is formed on an inner wall of the penetration hole in the first substrate, the penetration electrode having a conductor layer is situated on the inner side of the insulating film, the recessed portion is arranged in the conductor layer, the conductor layer is made of two or more kinds of material, a surface of the recessed portion on the back surface side is made of a material having the lowest melting point, and the material with the low melting point and the protruding electrode formed on the second substrate are joined by metal-metal junction.

According to this application example, since the conductor layer is made of two or more kinds of material and the surface of the recessed portion on the back surface side is made of a material having the lowest melting point, metal-metal junction with the protruding electrode can be realized at a lower temperature and thermal stress can be reduced. Therefore, reliability of connection between the first substrate and the second substrate can be improved.

Application Example 5

In the semiconductor device of the above application example, it is preferable that the material with the low melting point is a brazing material.

According to this application example, since a brazing material is used, metal-metal junction can be easily carried out and therefore reliability of connection between the first substrate and the second substrate can be improved.

Application Example 6

In the semiconductor device of the above application example, it is preferable that the distal width b of the protruding electrode formed on the second electrode of the second substrate and a width e of the protruding electrode on the side of the second electrode are in a relation of b<e.

According to this application example, since the width on the second electrode side is greater than the distal width of the protruding electrode, strength of the protruding electrode can be improved even if the distal width is small. Therefore, reliability of connection between the first substrate and the second substrate can be improved.

Application Example 7

This application example of the invention is directed to a sensor including the semiconductor device of the above application example.

According to this application example, a highly reliable sensor can be provided since the semiconductor device is installed therein.

Application Example 8

This application example of the invention is directed to an electronic device including the semiconductor device of the above application example.

According to this application example, a highly reliable electronic device can be provided since the electronic device includes the semiconductor device.

BRIEF DESCRIPTION OF THE DRAWINGS

The invention will be described with reference to the accompanying drawings, wherein like numbers reference like elements.

FIGS. 1A to 1D are sectional views illustrating a process of manufacturing a first substrate in Embodiment 1.

FIG. 5 shows the state where the first substrate and the second substrate are stacked in Embodiment 1.

FIG. 6 shows the state where semiconductor substrates are stacked in Embodiment 2.

DESCRIPTION OF EXEMPLARY EMBODIMENTS

Figure 2A:
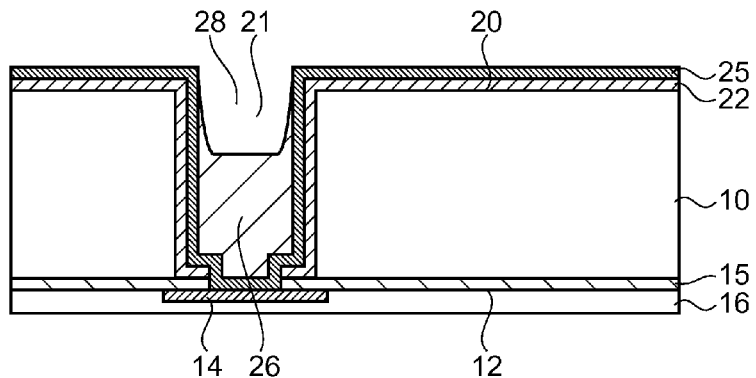
FIGS. 2A to 2C are sectional view illustrating the process of manufacturing the first substrate in Embodiment 1.

Hereinafter, embodiments of the invention will be described with reference to the drawings. In the drawings, in order to show each layer or member in recognizable sizes, each layer or member is not drawn to actual scale.

Embodiment 1

FIGS. 1A to 1D and FIGS. 2A to 2C are sectional views illustrating a process of manufacturing a first substrate of this embodiment. FIG. 3 is a sectional view illustrating a process of manufacturing a second substrate of this embodiment.

In this embodiment, a semiconductor substrate 10 is used as a first substrate. The semiconductor substrate 10 shown in FIG. 1A is a semiconductor wafer but the semiconductor substrate 10 may be a semiconductor chip. In the semiconductor substrate 10, at least one integrated circuit (plural on a semiconductor wafer, or one on a semiconductor chip) (for example, a circuit having a transistor and a memory (not shown)) is formed on a first surface 12 as a main surface. On the semiconductor substrate 10, electrodes (for example, pads) 14 as plural first electrodes are formed. Each electrode 14 is electrically connected to the integrated circuit. Each electrode 14 may be made of aluminum (Al) or the like. The surface shape of the electrode 14 is not particularly limited but the shape is often rectangular. If the semiconductor substrate 10 is a semiconductor wafer, two or more (one group of) electrodes 14 are formed in each area that forms plural semiconductor chips.

On the semiconductor substrate 10, one or more layers of passivation film 16 are formed. The passivation film 16 can be made of, for example, $SiO_2$, SiN, polyimde resin or the like. After the passivation film 16 is formed to cover the surface of the electrode 14, a portion of the passivation film 16 may be etched to expose a portion of the electrode 14. Either of dry etching and wet etching may be used for this etching. In etching the passivation film 16, the surface of the electrode 14 may be etched.

In this embodiment, a penetration hole 21 is formed to reach an insulating layer 15 on the electrode 14 from a second surface (surface opposite to the first surface 12) 20 which is a back surface of the semiconductor substrate 10, as shown in FIG. 1A. Etching (dry etching or wet etching) may be used to form the penetration hole 21. Etching may be carried out after a patterned resist (not shown) is formed by lithography. Alternatively, a laser (for example, $CO_2$ laser, YAG laser or the like) may be used to form the penetration hole 21. The insulating layer 15 may be, for example, $SiO_2$ or SiN.

Next, an insulating film 22 is formed on an inner surface of the penetration hole 21, as shown in FIG. 1B. The insulating film 22 may be an oxide film. For example, if the base material of the semiconductor substrate 10 is Si, the insulating film may be $SiO_2$ or SiN or may be a resin. An insulating film may also be formed on the second surface 20 and on a bottom part of the penetration hole 21 (on the insulating layer 15).

Subsequently, an opening 23 continuing from the bottom part of the penetration hole 21 to the electrode 14 is formed, as shown in FIG. 1C. The opening 23 may be smaller than the penetration hole 21. Etching (dry etching or wet etching) may be used to form the opening 23. Etching may be carried out after a patterned resist (not shown) is formed on the insulating film 22 by lithography.

A conductor layer 25 is formed in the penetration hole 21, as shown in FIG. 1D. Sputtering may be used to form the conductor layer 25. The conductor layer 25 may include at least a barrier layer. The barrier layer is adapted to prevent the material of a layer formed thereon from being dispersed into the semiconductor substrate 10 (for example, Si). The barrier layer may be made of, for example, TiW or TiN. A conductor layer may also be formed on the second surface 20 and the inner surface (inner side and bottom part) of the penetration hole 21. The conductor layer 25 may also include a seed layer. The seed layer is formed after the barrier layer is formed. The seed layer is made of, for example, Cu. The conductor layer 25 may be in contact with the electrode 14.

Figure 3:
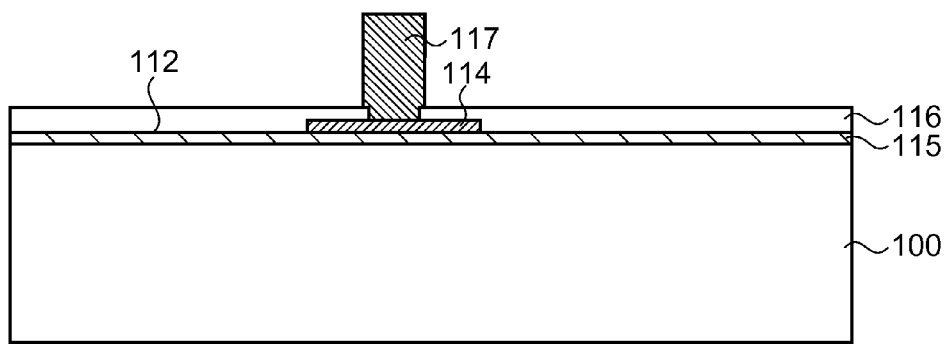
FIG. 3 is a sectional view illustrating a process of manufacturing a second substrate in Embodiment 1.

Next, a conductor layer 26 is formed in the penetration hole 21 so as to form a recessed portion 28, as shown in FIG. 2A. The conductor layer 26 may be provided by electroplating using the conductor layer 25 as a seed layer. The conductor layer 26 may be made of, for example, Cu. The recessed portion 28 may be formed with an opening expanding toward the second surface 20 from a bottom part thereof.

Figure 2B:
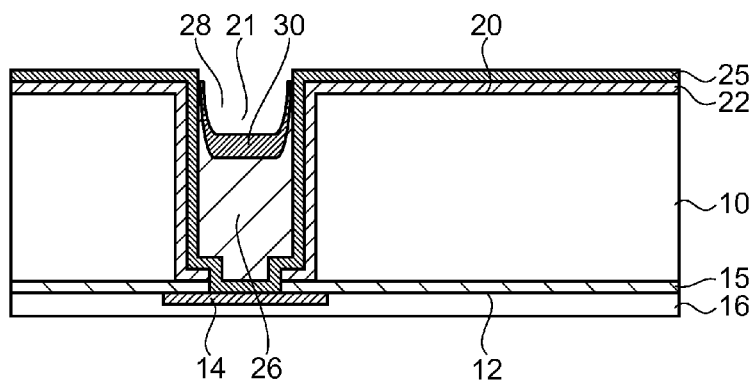

Subsequently, a brazing material layer 30 is formed on the surface of the conductor layer 26 in such a manner that the recessed portion 28 is not completely filled, as shown in FIG. 2B. The brazing material layer 30 may be formed by electroplating using the conductor layer 25 as a seed layer after a patterned resist (not shown) is formed on the conductor layer 25. Alternatively, the brazing material may be melted and ejected or dripped into the recessed portion 28 by an inkjet method or the like. The recessed portion 28 may be formed with the opening thereof expanding toward the second surface 20 from the bottom surface. The brazing material layer 30 may be made of at least one or plural materials, for example, Sn, Ag, Cu, Zn, In, Bi, Ni, and Pb. As the brazing material, a brazing material having a lower melting point than the conductor layers 25, 26 is employed. The thickness of the brazing material layer 30 is approximately 2 to 10 μm.

Figure 2C:
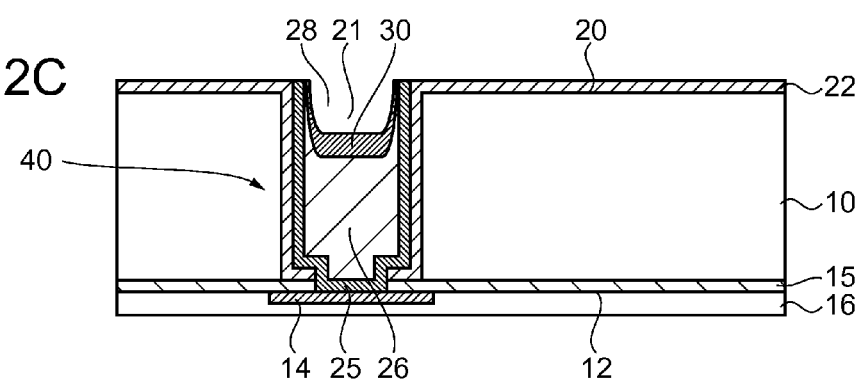

Then, the conductor layer 25 formed on the second surface 20 of the semiconductor substrate 10 is removed, as shown in FIG. 2C. Etching (dry etching or wet etching) may be used to remove the conductor layer 25.

By the above process, a penetration electrode 40 can be formed in the semiconductor substrate 10 as the first substrate. Although one penetration electrode is shown in FIGS. 1A to 1D and FIGS. 2A to 2C, the semiconductor substrate 10 has plural penetration electrodes 40. The penetration substrate 40 penetrates the semiconductor substrate from the electrode 14 on the first surface (main surface) 12 to the second surface (back surface) 20. The penetration electrode 40 has the recessed portion 28 on the side of the second surface 20. The recessed portion 28 may be formed with the opening thereof expanding toward the second surface 20 from the bottom part.

FIG. 3 shows a semiconductor substrate 100 as a second substrate. The semiconductor substrate 100 is a semiconductor wafer, but the semiconductor substrate 100 may be a semiconductor chip. In the semiconductor substrate 100, at least one integrated circuit (plural on a semiconductor wafer, or one on a semiconductor chip) (for example, a circuit having a transistor and a memory (not shown)) is formed on a first surface 112 as a main surface. An insulating layer 115 is formed on the circuit. For example, if the base material of the semiconductor substrate 100 is Si, the insulating layer may be $SiO_2$ or SiN. On the semiconductor substrate 100, electrodes (for example, pads) 114 as plural second electrodes are formed. Each electrode 114 is electrically connected to the integrated circuit. Each electrode 114 may be made of aluminum (Al) or the like. The surface shape of the electrode 114 is not particularly limited but the shape is often rectangular. If the semiconductor substrate 100 is a semiconductor wafer, two or more (one group of) electrodes 114 are formed in each area that forms plural semiconductor chips.

On the semiconductor substrate 100, one or more layers of passivation film 116 are formed. The passivation film 116 can be made of, for example, $SiO_2$, SiN, polyimde resin or the like. After the passivation film 116 is formed to cover the surface of the electrode 114, a portion of the passivation film 116 may be etched to expose a portion of the electrode 114. Either of dry etching and wet etching may be used for this etching. In etching the passivation film 116, the surface of the electrode 114 may be etched.

A protruding electrode 117 is formed on the exposed electrode 114. The protruding electrode 117 is formed in a columnar shape protruding in the direction of the thickness of the semiconductor substrate 100. The protruding electrode 117 may be provided by plating (electroplating or electroless plating). The protruding electrode 117 may be made of, for example, gold (Au).

Figure 4:
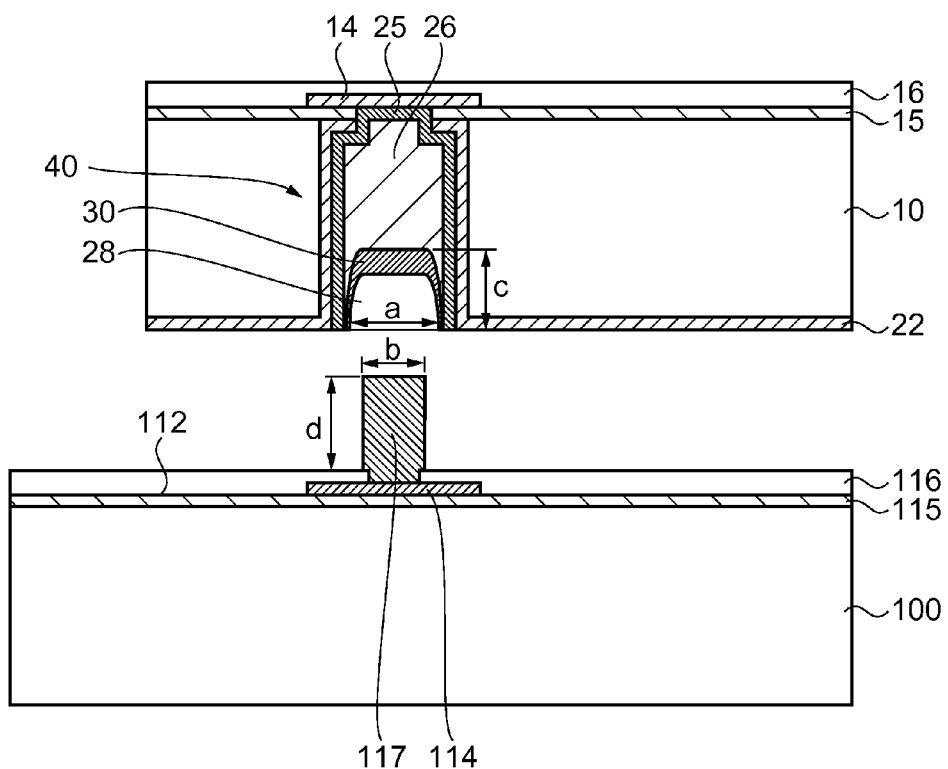
FIG. 4 shows the relation between a penetration electrode and a protruding electrode in Embodiment 1.

FIG. 4 shows the relation between the penetration electrode and the protruding electrode in this embodiment.

As shown in FIG. 4, the opening width a of the recessed portion 28 of the penetration electrode 40 in the semiconductor substrate 10 as the first substrate and the distal width b of the protruding electrode 117 on the semiconductor substrate 100 as the second substrate are in a relation of a>b. The depth c of the recessed portion 28 of the penetration electrode 40 in the semiconductor substrate 10 and the height d of the protruding electrode 117 on the semiconductor substrate 100 are in a relation of c<d. The depth c of the recessed portion 28 does not include the brazing material layer 30.

As shown in FIG. 5, the semiconductor substrate 10 as the first substrate and the semiconductor substrate 100 as the second substrate are stacked on each other. At this point, the protruding electrode 117 on the semiconductor substrate 100 is entered in the recessed portion 28 of the penetration electrode 40 in the semiconductor substrate 10. Since the distal width b of the protruding electrode 117 on the semiconductor substrate 100 is smaller than the opening width a of the recessed portion 28 of the penetration electrode 40 in the semiconductor substrate 10, the protruding electrode 117 can be easily entered and the substrates can be prevented from being damaged. Moreover, the recessed portion 28 is formed with the opening thereof expanding toward the second surface 20 from the bottom part. Thus, the protruding electrode 117 on the semiconductor substrate 100 can be easily entered in the recessed portion 28 of the semiconductor substrate 10.

The brazing material layer 30 of the semiconductor substrate 10 and the protruding electrode 117 on the semiconductor substrate 100 may be joined by metal-metal junction. A semiconductor device 5 is thus manufactured.

Since the brazing material layer 30 has a lower melting point than the conductor layers 25, 26 of the semiconductor substrate 10, junction at a lower temperature is possible and metal-metal junction can be carried out easily. Thus, stress can be reduced and therefore reliability of connection between the semiconductor substrates can be improved.

Since the height d of the protruding electrode 117 on the semiconductor substrate 100 is greater than the depth c of the recessed portion 28 of the penetration electrode 40 in the semiconductor substrate 10, an appropriate space can be maintained between the semiconductor substrate 10 and the semiconductor substrate 100. Therefore, reliability of connection can be improved. The space between the semiconductor substrate 10 and the semiconductor substrate 100 (between the second surface 20 of the semiconductor substrate 10 and the first surface 112 of the semiconductor substrate 100) may be filled with a sealing resin (not shown).

As described above, this embodiment has the following advantages.

The semiconductor substrate 10 as the first substrate is stacked on the semiconductor substrate 100 as the second substrate. At this point, the protruding electrode 117 on the semiconductor substrate 100 enters the recessed portion 28 of the penetration electrode 40 in the semiconductor substrate 10. Since the distal width b of the protruding electrode 117 on the semiconductor substrate 100 is smaller than the opening width a of the recessed portion 28 of the penetration electrode 40 in the semiconductor substrate 10, the protruding electrode 117 can be easily entered and the semiconductor substrates 10, 100 can be prevented from being damaged. Since the recessed portion 28 is formed to expand toward the opening end from the bottom, the protruding electrode 117 on the semiconductor substrate 100 can be easily entered in the recessed portion 28 of semiconductor substrate 10. Moreover, since the height d of the protruding electrode 117 on the semiconductor substrate 100 is greater than the depth c of the recessed portion 28 of the penetration electrode 40 in the semiconductor substrate 10, an appropriate space can be maintained between the semiconductor substrate 10 and the semiconductor substrate 100 and reliability of connection can be improved.

Embodiment 2

FIG. 6 shows the state where semiconductor substrates are stacked according to Embodiment 2.

A semiconductor device according to this embodiment will be described with reference to FIG. 6. The same components as in Embodiment 1 are denoted by the same reference numerals and duplicate explanation thereof is not given.

In this embodiment, a semiconductor substrate 200 as a third substrate is stacked between the semiconductor substrate 10 as the first substrate and the semiconductor substrate 100 as the second substrate.

The semiconductor substrate 200 has a penetration electrode 240, which has the same configuration as the penetration electrode 40 in the semiconductor substrate 10. On an electrode 214 of the semiconductor substrate 200, one or more layers of passivation film 216 are formed. The passivation film 216 can be made of, for example, $SiO_2$, SiN, polyimde resin or the like. After the passivation film 216 is formed to cover the surface of the electrode 214, a portion of the passivation film 216 may be etched to expose a portion of the electrode 214. Either of dry etching and wet etching may be used for this etching. In etching the passivation film 216, the surface of the electrode 214 may be etched.

A protruding electrode 217 is formed on the exposed electrode 214. The protruding electrode 217 may be provided by plating (electroplating or electroless plating). The protruding electrode 217 may be made of, for example, gold (Au).

The penetration electrode 240 in the semiconductor substrate 200 has a recessed portion 228, in which the protruding electrode 117 on the semiconductor substrate 100 is entered. In the recessed portion 28 of the penetration electrode 40 in the semiconductor substrate 10, the protruding electrode 217 on the semiconductor substrate 200 is entered. Since the distal width of the protruding electrode 117 on the semiconductor substrate 100 is smaller than the opening width of the recessed portion 228 of the penetration electrode 240 in the semiconductor substrate 200, and the distal width of the protruding electrode 217 on the semiconductor substrate 200 is smaller than the opening width of the recessed portion 28 of the penetration electrode 40 in the semiconductor substrate 10, the protruding electrodes can be easily entered and the semiconductor substrates can be prevented from being damaged. Moreover, the recessed portion 228 and the recessed portion 28 may be formed to expand toward the opening end from the bottom. Thus, the protruding electrode 117 on the semiconductor substrate 100 can be easily entered in the recessed portion 228 of semiconductor substrate 200, and the protruding electrode 217 on the semiconductor substrate 200 can be easily entered in the recessed portion 28 of the semiconductor substrate 10.

The brazing material layer 30 of the semiconductor substrate 10 and the protruding electrode 217 on the semiconductor substrate 200, and a brazing material layer 230 of the semiconductor substrate 200 and the protruding electrode 117 on the semiconductor substrate 100, may be joined by metal-metal junction. A semiconductor device 6 is thus manufactured.

Since the brazing material layer 30 has a lower melting point than the conductor layers 25, 26 of the semiconductor substrate 10, and the brazing material layer 230 has a lower melting point than conductor layers 225, 226 of the semiconductor substrate 200, junction at a lower temperature is possible and metal-metal junction can be carried out easily. Thus, stress can be reduced and therefore reliability of connection can be improved.

Since the height of the protruding electrode 217 on the semiconductor substrate 200 is greater than the depth of the recessed portion 28 of the penetration electrode 40 in the semiconductor substrate 10, and the height of the protruding electrode 117 on the semiconductor substrate 100 is greater than the depth of the recessed portion 228 of the penetration electrode 240 in the semiconductor substrate 200, an appropriate space can be maintained between the semiconductor substrate 10 and the semiconductor substrate 200 and between the semiconductor substrate 200 and the semiconductor substrate 100. Therefore, reliability of connection can be improved. The space between the semiconductor substrate 10 and the semiconductor substrate 200 and the space between the semiconductor substrate 200 and the semiconductor substrate 100 may be filled with a sealing resin (not shown).

As described above, this embodiment has the following advantages in addition to the advantages of Embodiment 1.

The semiconductor substrate 200 as the third substrate is stacked on the semiconductor substrate 100 as the second substrate, and the semiconductor substrate 10 as the first substrate is stacked on the semiconductor substrate 200. At this point, since the distal width of the protruding electrode 217 on the semiconductor substrate 200 is smaller than the opening width of the recessed portion 28 of the penetration electrode 40 in the semiconductor substrate 10, and the distal width of the protruding electrode 117 on the semiconductor substrate 100 is smaller than the opening width of the recessed portion 228 of the penetration electrode 240 in the semiconductor substrate 200, the protruding electrodes can be easily entered and the semiconductor substrates 10, 100, 200 can be prevented from being damaged even if the number of stacked substrates is greater than in Embodiment 1. Since the recessed portion 228 is formed to expand toward the opening end from the bottom similarly to the recessed portion 28, the protruding electrode 117 on the semiconductor substrate 100 can be easily entered in the recessed portion 228 of semiconductor substrate 200, and the protruding electrode 217 on the semiconductor substrate 200 can be easily entered in the recessed portion 28 of the semiconductor substrate 10. Moreover, since the height of the protruding electrode 217 on the semiconductor substrate 200 is greater than the depth of the recessed portion 28 of the penetration electrode 40 in the semiconductor substrate 10, and the height of the protruding electrode 117 on the semiconductor substrate 100 is greater than the depth of the recessed portion 228 of the penetration electrode 240 in the semiconductor substrate 200, an appropriate space can be maintained between the semiconductor substrate 10 and the semiconductor substrate 200 and between the semiconductor substrate 200 and the semiconductor substrate 100. Thus, reliability of connection between the semiconductor substrates can be improved.

The invention is not limited to the embodiments and various changes and improvements can be made to the embodiments. Modifications will be described hereinafter.

Modification 1

Figure 7:
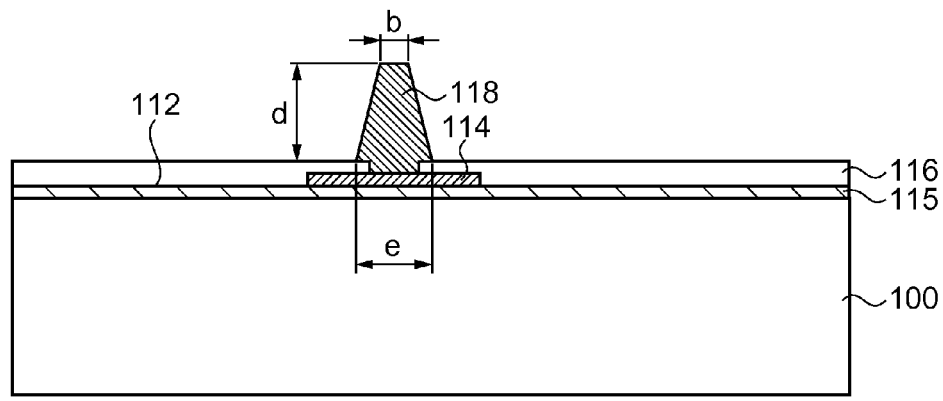
FIG. 7 shows the shape of the protruding electrode in Modification 1.
Figure 8:
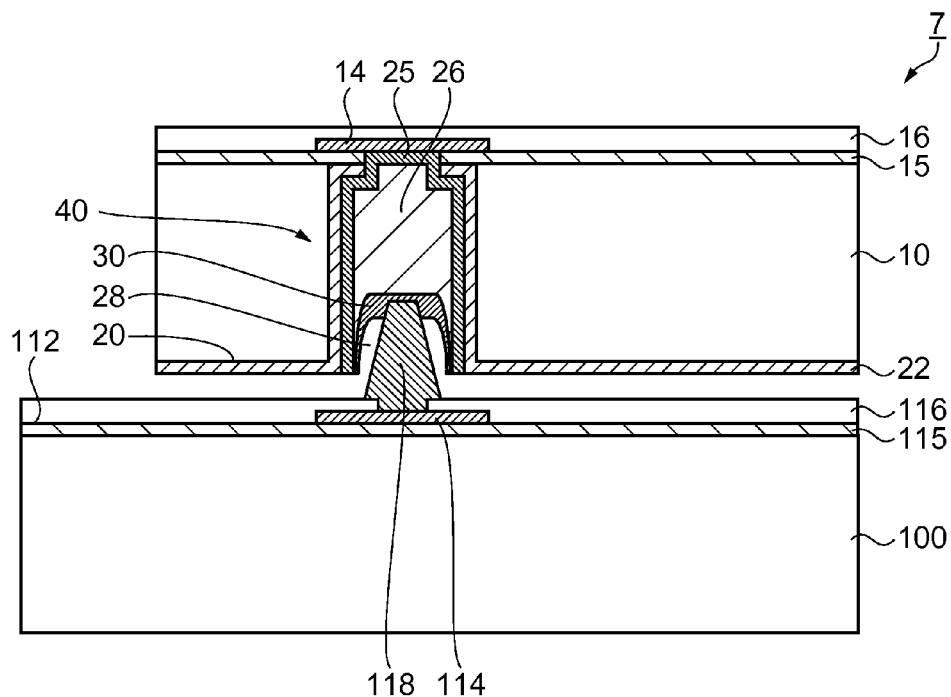
FIG. 8 shows the state where the first substrate and the second substrate are stacked in Modification 1.
Figure 9:
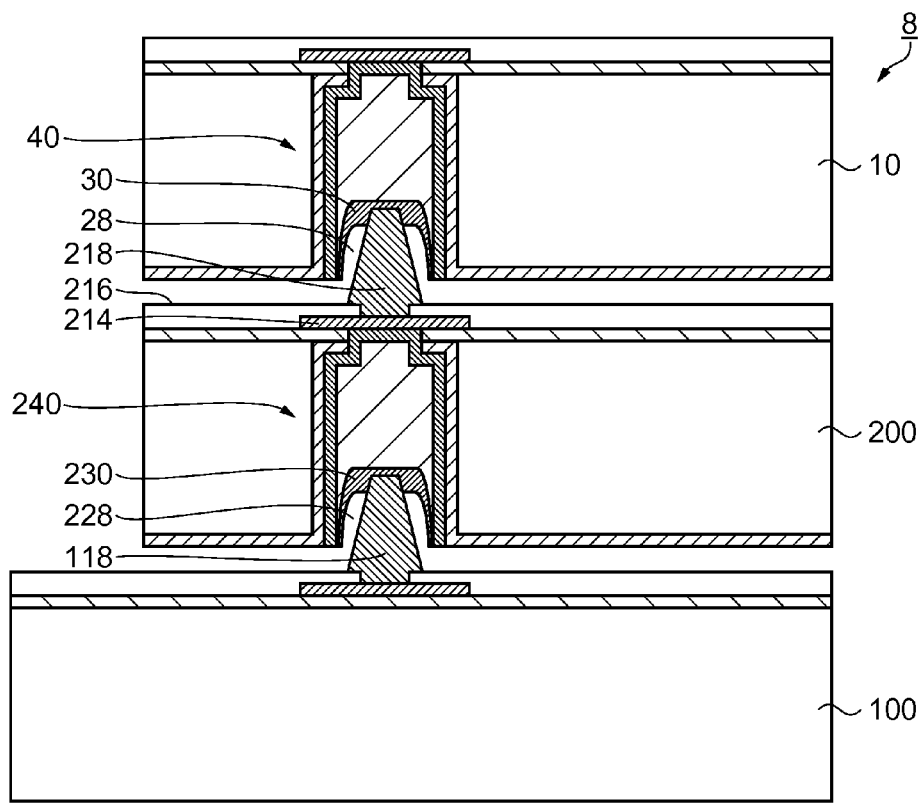
FIG. 9 shows another example of the state where the substrates are stacked in Modification 1.

FIG. 7, FIG. 8 and FIG. 9 relate to Modification 1. Hereinafter, Modification 1 will be described. The same components as in Embodiments 1 and 2 are denoted by the same reference numerals and duplicate explanation thereof is not given.

FIG. 7 and FIG. 8 show a modification of Embodiment 1.

The distal width b of a protruding electrode 118 on the semiconductor substrate 100 and the width e thereof on the side of the electrode 114 is in a relation of b<e. In this embodiment, the protruding electrode 118 is formed in a truncated cone shape. Since the width e on the side of the electrode 114 is greater than the distal width b of the protruding electrode 118, strength of the protruding electrode in relation to the semiconductor substrate 100 can be improved even if the distal width is small. Thus, reliability of connection between the semiconductor substrates can be improved.

As shown in FIG. 8, in a semiconductor device 7, the semiconductor substrate 10 with the penetration electrode 40 formed therein is stacked on the semiconductor substrate 100 with the protruding electrode 118 formed thereon. Since the distal width of the protruding electrode 118 is smaller than the width thereof on the side of the electrode 114, the distal width of the protruding electrode 118 on the semiconductor substrate 100 is sufficiently smaller than the opening width of the recessed portion 28 of the penetration electrode 40 and therefore the protruding electrode can be easily entered. Thus, the substrates can be prevented from being damaged. Moreover, since the recessed portion 28 is formed with the opening expanding toward the second surface 20 from the bottom part, the protruding electrode 118 on the semiconductor substrate 100 can be easily entered in the recessed portion 28 of the semiconductor substrate 10. The brazing material layer 30 of the semiconductor substrate 10 and the protruding electrode 118 on the semiconductor substrate 100 may be joined by metal-metal junction.

Since the height of the protruding electrode 118 on the semiconductor substrate 100 is greater than the depth of the recessed portion 28 of the penetration electrode 40 in the semiconductor substrate 10, an appropriate space can be maintained between the semiconductor substrate 10 and the semiconductor substrate 100 and reliability of connection can be improved. The space between the semiconductor substrate 10 and the semiconductor substrate 100 (between the second surface 20 of the semiconductor substrate 10 and the first surface 112 of the semiconductor substrate 100) may be filled with a sealing resin (not shown).

FIG. 9 shows a modification of Embodiment 2. In a semiconductor device 8, a protruding electrode 218 on the semiconductor substrate 200 as well as the protruding electrode 118 on the semiconductor substrate 100 has a smaller distal width than a width on the side of the electrode 214. The brazing material layer 30 of the semiconductor substrate 10 and the protruding electrode 218 on the semiconductor substrate 200, and the brazing material layer 230 of the semiconductor substrate 200 and the protruding electrode 118 on the semiconductor substrate 100, may be joined by metal-metal junction. The space between the semiconductor substrate 10 and the semiconductor substrate 200 and the space between the semiconductor substrate 200 and the semiconductor substrate 100 may be filled with a sealing resin (not shown).

As described above, this modification has the following advantages in addition to the advantages of Embodiments 1 and 2.

Since the distal width of the protruding electrode is sufficiently smaller than the opening width of the recessed portion of the penetration electrode, the protruding electrode can be easily entered and the substrates can be prevented from being damaged. Moreover, since the recessed portion is formed to expand toward the opening end from the bottom, the protruding electrode can be easily entered in the recessed portion of the semiconductor substrate.

Figure 10A:
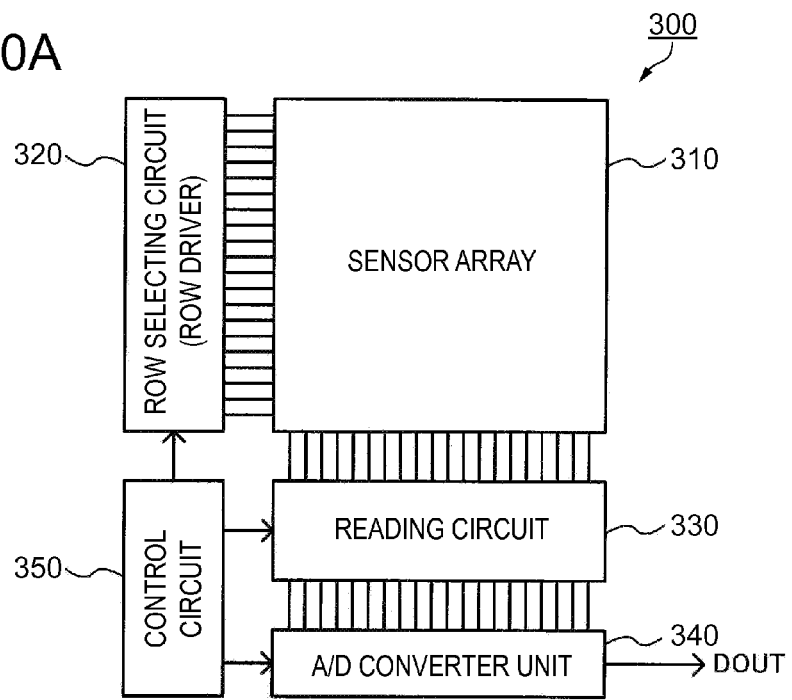
FIGS. 10A and 10B show a sensor according to an application of embodiment.
Figure 10B:
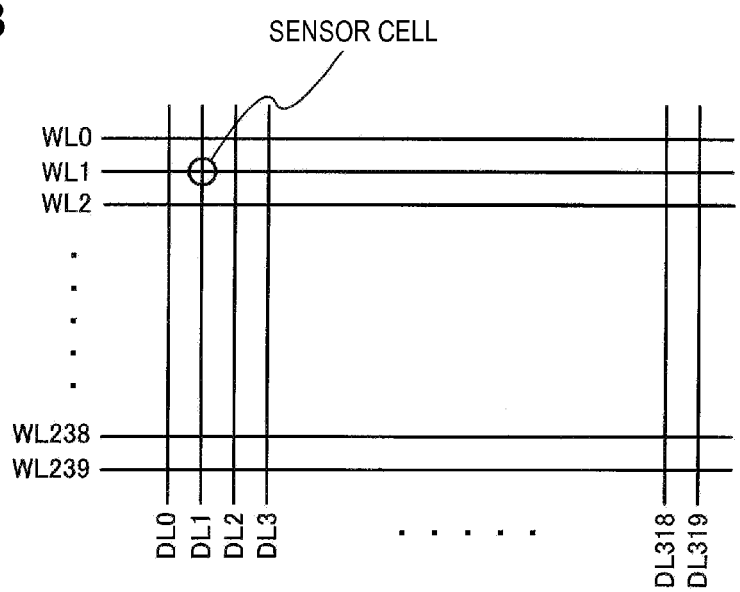

FIGS. 10A and 10B show a sensor 300 in which the semiconductor device according to the invention is installed.

FIG. 10A shows an example of configuration of the sensor 300. This sensor includes a sensor array 310, a row selecting circuit (row driver) 320, and a reading circuit 330. The sensor can also include an A/D converter unit 340 and a control circuit 350. Using this sensor, for example, an infrared camera used for a night vision device or the like can be realized.

In the sensor array 310, plural sensor cells are arrayed (arranged) in biaxial directions. Plural row lines (word lines, scanning lines) and plural column lines (data lines) are provided. Either the number of row lines or the number of column lines may be one. For example, if there is only one row line, plural sensor cells are arrayed in a direction along the row line (laterally) in FIG. 10A. Meanwhile, if there is only one column line, plural sensor cells are arrayed in a direction along the column line (longitudinally).

As shown in FIG. 10B, each sensor cell of the sensor array 310 is arranged (formed) at a position corresponding to a point of intersection between each row line and each column line). For example, the sensor cell of FIG. 10B is arranged at a position corresponding to a point of intersection between a row line WL1 and a column line DL1. Other sensor cells are similarly arranged. The row selecting circuit 320 is connected to one or plural row lines. The row selecting circuit 320 selects the row lines. By way of example, in the QVGA (320×240 pixels) sensor array 310 (focal surface array) as shown in FIG. 10B, the row selecting circuit 320 sequentially selects (scans) row lines WL0, WL1, WL2, . . . WL239. That is, a signal (word selecting signal) for selecting these row lines is outputted to the sensor array 310.

The reading circuit 330 is connected to one or plural column lines. The reading circuit 330 reads the column lines. By way of example, in the QVGA sensor array 310, the reading circuit 330 reads detected signals (detected current, detected charge) from column lines DL0, DL1, DL2, . . . DL319.

The A/D converter unit 340 performs A/D conversion to convert the detected voltage (measured voltage, achieved voltage) acquired by the reading circuit 330 to digital data. The A/D converter unit 340 then outputs A/D-converted digital data DOUT. Specifically, the A/D converter unit 340 is provided with each A/D converter corresponding to each of the plural column lines. Each A/D converter performs A/D conversion of the detected voltage acquired by the reading circuit 330 in the corresponding column line. One A/D converter for the plural column lines may be provided, and the detected voltages of the plural column lines may be A/D-converted in a time divisional manner using this one A/D converter.

The control circuit 350 (timing generator circuit) generates various control signals and outputs the control signals to the row selecting circuit 320, the reading circuit 330, and the A/D converter unit 340. For example, the control circuit 350 generates and outputs a control signal for charge and discharge (reset). Alternatively, the control circuit 350 generates and outputs a signal to control timing of each circuit.

Figure 11:
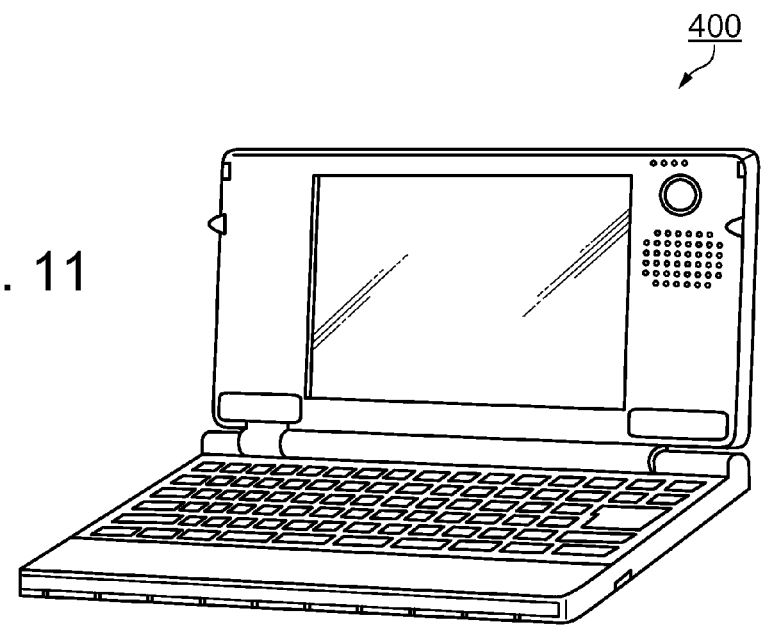
FIG. 11 shows an electronic device according to an application of embodiment.
Figure 12:
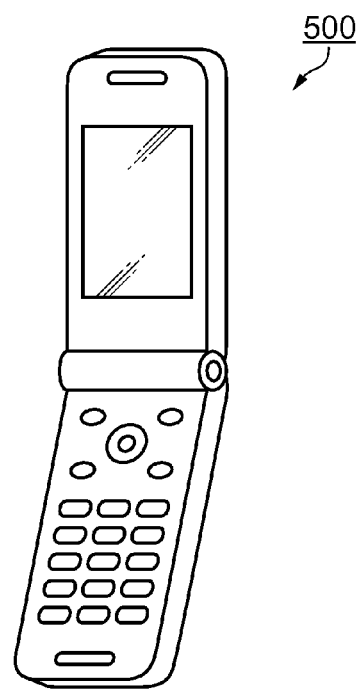
FIG. 12 shows another electronic device according to an application of embodiment.

Examples of an electronic device according to the invention may include a personal computer 400 shown in FIG. 11 and a mobile phone 500 shown in FIG. 12 and the like. In all these devices, the semiconductor device described in the embodiments is installed as an internal device.

The invention is not limited to the embodiments and various modifications can be made. For example, the invention includes substantially the same configurations as the configurations described in the embodiments (for example, configurations with the same functions, methods and results, or configurations with the same objects and results). The invention also includes the configurations described in the embodiments in which non-essential parts are replaced. The invention also includes configurations having the same effects and advantages as the configurations described in the embodiments, or configurations that enable achievement of the same objects. The invention also includes known techniques added to the configurations described in the embodiments.

What is claimed is:

1. A semiconductor device comprising:
    a first substrate having a first face and a second face;
    a penetration electrode that is disposed so as to penetrate the first substrate;
    a second substrate; and
    a protruding electrode that protrudes from the second substrate,
    the penetration electrode having a recess at a first face side, and
    the protruding electrode entering into the recess,
    a thickness of the penetration electrode in a direction crossing a direction from the first face to the second face being thicker toward a bottom of the recess from the first face side.

2. The semiconductor device according to claim 1,
    an opening of the recess expanding toward the first face from the bottom.

3. The semiconductor device according to claim 1,
    the penetration electrode having a first part and a second part,
    a melting point of the second part is lower than a melting point of the first part, and
    the second part and the protruding electrode being connected by a metal-metal junction.

4. The semiconductor device according to claim 1,
    an opening width a of the recess at the first face side and a distal width b of the protruding electrode having a relation of a>b.

5. The semiconductor device according to claim 1,
    the second part containing a brazing material.

6. The semiconductor device according to claim 1, further comprising:
    a first electrode that is disposed at a second face side of the first electrode; and
    a passivation layer that covers a portion of the first electrode.

7. A sensor comprising the semiconductor device according to claim 1.

8. An electronic device comprising the semiconductor device according to claim 1.

* * * * *